United States Patent [19]

Bercaw et al.

[11] Patent Number: 5,756,222
[45] Date of Patent: May 26, 1998

[54] CORROSION-RESISTANT ALUMINUM ARTICLE FOR SEMICONDUCTOR PROCESSING EQUIPMENT

[75] Inventors: Craig A. Bercaw, Sunnyvale; Laxman Murugesh, Santa Clara; Joshua E. Byrne, Los Altos, all of Calif.

[73] Assignee: Applied Materials, Inc., Santa Clara, Calif.

[21] Appl. No.: 291,367

[22] Filed: Aug. 15, 1994

[51] Int. Cl.$^6$ ............... B32B 9/04; B32B 15/04; B32B 15/20; B32B 18/00

[52] U.S. Cl. .......... 428/649; 428/650; 428/215; 428/336; 428/469; 428/696; 428/701

[58] Field of Search ............... 428/701, 472, 428/698, 697, 649, 650, 469, 471, 472.2, 696, 699; 148/272, 276, 275, 283, 285; 205/171, 172, 183, 184, 186, 191, 192, 199

[56] References Cited

U.S. PATENT DOCUMENTS

| | | | |
|---|---|---|---|
| 3,784,371 | 1/1974 | Bangs et al. | 75/68 R |
| 4,551,211 | 11/1985 | Kobayashi et al. | 254/37.6 |
| 4,872,947 | 10/1989 | Wang et al. | 156/643 |
| 4,978,432 | 12/1990 | Schmeling et al. | 204/58.4 |
| 5,039,388 | 8/1991 | Miyashita et al. | 204/192.32 |
| 5,069,938 | 12/1991 | Lorimer et al. | 427/255.1 |
| 5,158,644 | 10/1992 | Cheung et al. | 156/643 |
| 5,192,610 | 3/1993 | Lorimer et al. | 428/33.6 |
| 5,364,496 | 11/1994 | Bollinger et al. | 156/643 |
| 5,403,657 | 4/1995 | Textor et al. | 428/336 |

FOREIGN PATENT DOCUMENTS

| | | |
|---|---|---|
| 89307252 | 1/1990 | European Pat. Off. |
| 91109362 | 12/1991 | European Pat. Off. |
| 91109363 | 12/1991 | European Pat. Off. |
| 900176290 | 3/1992 | Japan |
| 910113251 | 11/1992 | Japan |
| 920227326 | 3/1994 | Japan |

OTHER PUBLICATIONS

W. Hufnagel, *Aluminium-Taschenbuch*, Aluminium-Zentrale, Dusseldorf, pp. 711-714 and Table 14.2 (1984).

C. Lea, C. Molinari, "Magnesium diffusion, surface segregation and oxidation in Al-Mg alloys" *Journal Of Materials Science*, vol. 19, pp. 2336-2352 (1984).

Primary Examiner—Paul J. Thibodeau
Assistant Examiner—Vivian Chen
Attorney, Agent, or Firm—Shirley L. Church

[57] ABSTRACT

Corrosion of an aluminum article exposed to corrosive halogen-containing species within semiconductor processing apparatus is avoided by fabricating the aluminum article from a high purity aluminum-magnesium alloy having a magnesium content of about 0.1% to 1.5% by weight, either throughout the entire article or at least in the surface region which is to be rendered corrosion-resistant, and a mobile impurity atom content of less than 0.2% by weight. Upon exposure of the article to a halogen-containing species, a protective magnesium halide layer is formed beneath the surface of the article. The protective layer prevents halogens from penetrating to the base aluminum, thereby protecting the article from corrosion and cracking. To protect the magnesium layer from abrasion, the article preferably also includes a hard, cohesive coating over the magnesium halide layer. A preferred cohesive coating is aluminum oxide or aluminum nitride.

29 Claims, 3 Drawing Sheets

CORROSION-RESISTANT ALUMINUM ARTICLE FOR SEMICONDUCTOR PROCESSING EQUIPMENT

BACKGROUND OF THE INVENTION

1. Field of the Invention

The present invention pertains to an aluminum article having a magnesium halide layer which protects the article from corrosion within semiconductor processing apparatus employing halogen-containing species for etching or cleaning.

2. Brief Description of the Background Art

Semiconductor processing involves a number of different chemical and physical processes whereby minute integrated circuits are created on a substrate. The integrated circuits are constructed using multilayers of interrelated patterns of various materials. The materials within the integrated circuit are created by chemical vapor deposition, physical vapor deposition and epitaxial growth. Some of the layers of material are patterned using photoresist masks and wet and dry etching techniques. Patterns are created within layers by the implantation of dopants at particular locations. The substrate upon which the integrated circuit is created may be silicon, gallium arsenide, glass, or any other appropriate material.

Many of the processes used to produce integrated circuits utilize halogen gases, halogen-containing gas, or halogen-containing liquids. In addition, since the processes used to create integrated circuits leave contaminant deposits on the surfaces of the processing apparatus, such deposits are commonly removed using dry etching, plasma cleaning with at least one halogen-containing gas.

Aluminum has been widely used as a construction material for semiconductor fabrication equipment, at times because of its conductive properties, and generally because of ease in fabrication and availability at a reasonable price. However, aluminum is susceptible to reaction with halogens such as chlorine, fluorine, and bromine, to produce, for example, $AlCl_3$ (or $Al_2Cl_6$); or $AlF_3$; or $AlBr_3$ (or $Al_2Br_6$). The aluminum-fluorine compounds can flake off the surfaces of process apparatus parts, causing an eroding away of the parts themselves, and serving as a source of particulate contamination of the process chamber (and parts produced in the chamber). Most of the compounds containing aluminum and chlorine and many of the compounds containing aluminum and bromine are gaseous under semiconductor processing conditions and leave the aluminum structure, and creating voids which render the structure unstable and with a surface having questionable integrity.

A preferred means of protection of the aluminum surfaces within process apparatus has been an anodized aluminum coating. Anodizing is an electrolytic oxidation process that produces an integral coating of porous aluminum oxide on the aluminum surface. Despite the use of anodized aluminum coatings, the lifetime of anodized aluminum parts, such as susceptors in CVD reactor chambers is limited due to the degradation of the anodized film in the plasma cleaning environment. Failure of the anodized film protective layer over an aluminum surface leads to excessive particulate generation within the reactor chamber, requiring maintenance downtime for replacing the failed aluminum parts and for cleaning particulates from the rest of the chamber. Miyashita et al., in U.S. Pat. No. 5,039,388, issued Aug. 13, 1991, describe a plasma forming electrode used in pairs in a semiconductor processing chamber. The electrode is formed from a high purity aluminum or an aluminum alloy having a chromic acid anodic film on the electrode surface. The chromic acid anodized surface is said to greatly improve durability when used in a plasma treatment process in the presence of fluorine-containing gas. The electrode is described as formed from a high purity aluminum such as JIS 1050, 1100, 3003, 5052, 5053, and 6061 or similar alloys such as Ag-Mg alloys containing 2 to 6% by weight magnesium.

Not only is there significant expense in equipment maintenance of the kind described above, but presently it is necessary to replace a susceptor in a CVD chamber after processing somewhere between about 500 and 5,000 silicon wafers, for example. A susceptor typically costs as high as about $5,000 to $6,000. If the susceptor develops significant surface defects, these defects can translate through a silicon wafer atop the susceptor, creating stresses in films deposited upon the silicon wafer. Stresses in deposited films can place the devices fabricated on the wafer out of specification. The loss of all the devices on a wafer can be at a cost as high as $50,000 to $60,000.

It would be highly desirable to have a means for protection of aluminum surfaces from attack by halogen atoms and ions, and by halogen-containing compounds. This would increase the lifetime of semiconductor apparatus parts fabricated from aluminum, reducing the expense of equipment maintenance and reducing the loss of devices which occurs when such apparatus fail during processing operations.

SUMMARY OF THE INVENTION

We have discovered that corrosion of an aluminum article (such as a susceptor) exposed to corrosive halogen-containing species within semiconductor processing apparatus can be avoided by fabricating the article from a high purity aluminum-magnesium alloy having an optimum magnesium content. Upon exposure of the article to a halogen-containing species, a protective magnesium halide layer is formed beneath the surface of the article. The protective layer prevents halogens from penetrating to the base aluminum, thereby protecting the article from corrosion and cracking.

To protect the magnesium halide layer from abrasion, the article preferably also includes a hard, cohesive coating over the magnesium halide layer. A preferred cohesive coating is aluminum oxide or aluminum nitride, which can be formed by a conventional anodization process before the aluminum article is exposed to a halogen-containing species to form the magnesium halide layer.

The magnesium content of the aluminum article should be in the range of about 0.1% to 1.5% by weight, either throughout the entire article, or at least in a region of the article beneath the surface which is to be rendered corrosion-resistant. The impurity content of the aluminum should be less than 0.2%, and preferably much less.

DETAILED DESCRIPTION OF THE PREFERRED EMBODIMENTS

Analytical Foundation of the Invention

Figure 1:
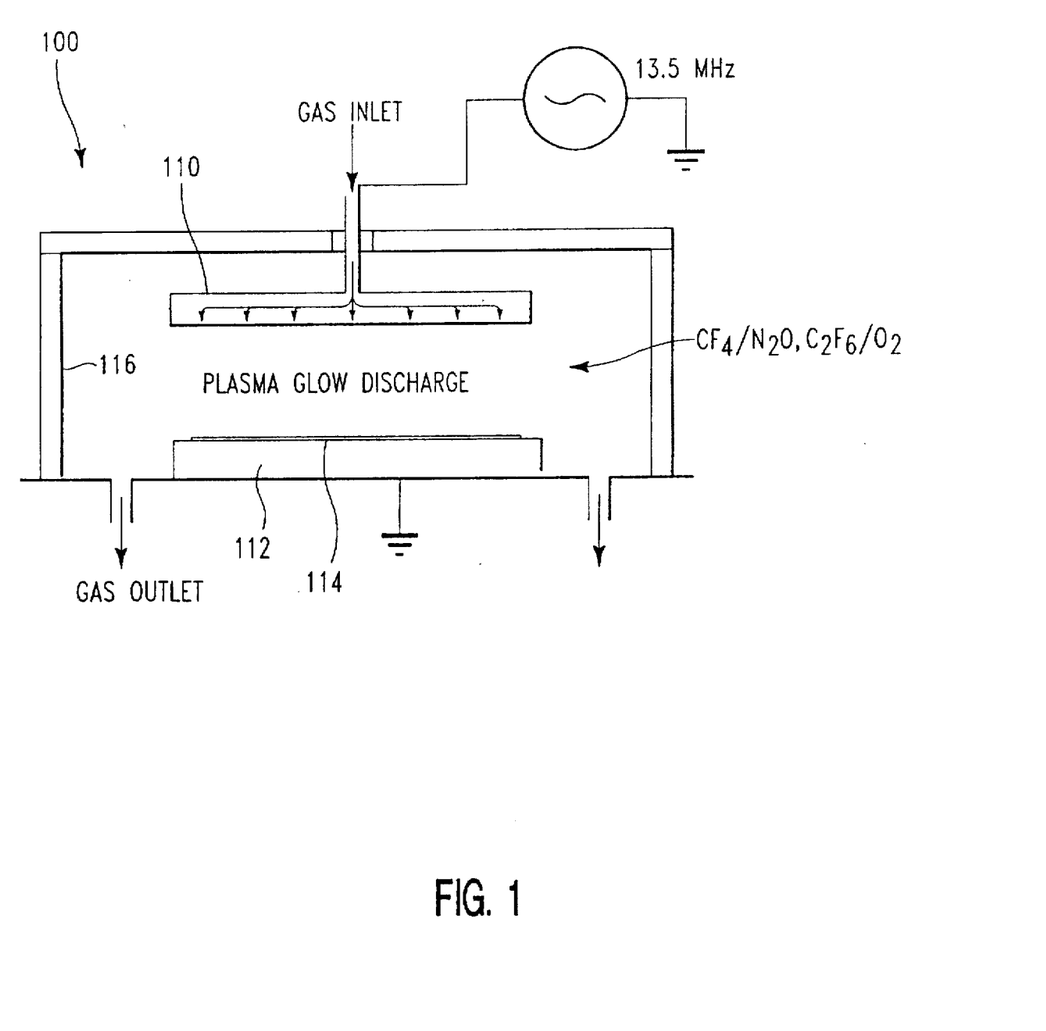
FIG. 1 shows a schematic of a CVD Reactor Chamber which includes a metallic plate which acts as a combination perforated gas inlet and RF electrode, as well as a metallic susceptor. Each of these semiconductor apparatus parts can be fabricated to contain the protective magnesium-halide layer of the present invention. In the alternative, these parts can be fabricated from an aluminum-magnesium alloy capable of forming the protective layer of the present invention.

FIG. 1 shows a conventional reactor chamber 100 used for semiconductor substrate fabrication processes such as chemical vapor deposition (CVD) or etching. Such processes typcially subject the components within the chamber to corrosive halogen-containing species. Particularly corrosive are the gas mixtures typically used to plasma-clean the chamber components, such as a mixture of $CF_4$ and $N_2O$, or a mixture of $C_2F_6$ and $O_2$. Chamber components are alternately subjected to high temperatures (typically 200° to 500° C.) during the CVD or etch processes, and to corrosive halogen gas mixtures during periodic chamber cleaning.

Certain chamber components, such as perforated plate 110 (which functions both to deliver process gases into the chamber and as an RF electrode for exciting a plasma) and susceptor 112 (which supports the semiconductor substrate 114 and often also funtions as an RF electrode) conventionally are constructed of anodized aluminum. Commonly used aluminum materials are Al 1100 and Al 6061.

Figure 2:
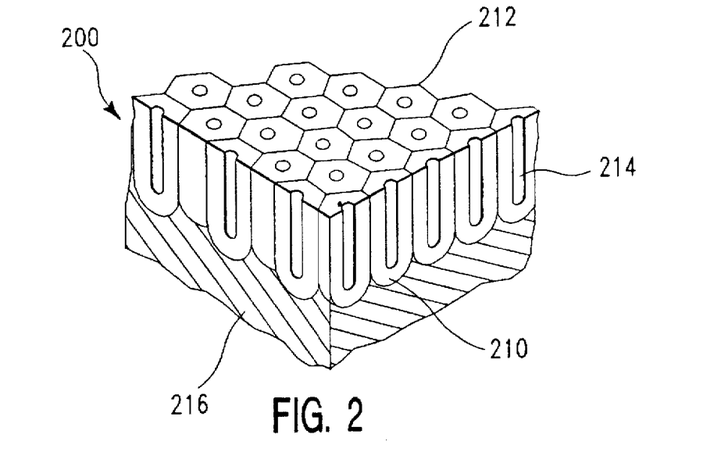
FIG. 2 illustrates the structure of an anodized aluminum film.

An anodization coating (aluminum oxide) on the aluminum is intended to protect the aluminum from corrosion. However, we have found that the oxide protective layer is relatively porous. FIG. 2 shows an aluminum oxide layer 200 having a thickness of 10 to 14 microns over an aluminum base 216. The oxide was created by a conventional electrolytic anodization process. The portion of the oxide layer immediately overlying the aluminum base 216 is a dense barrier layer 210 having a thickness of only 100 to 5000 Å. The remainder of the oxide layer is a matrix of hexagonal cells 212 having pores 214 about 100 to 2000 Å in diameter. These pores are larger than most halogen atoms; for example, fluorine atoms are only about 5Å in diameter. Thus, only the thin barrier layer 210 beneath the matrix of porous cells 212 protects the base aluminum alloy 216 from the corrosive halogen-containing gas mixtures commonly used in semiconductor process chambers.

Failure of the anodization (aluminum oxide) coating typically occurs in the form of pinholes and cracks. The cracks, in turn, lead to the subsequent flaking off of the protective coating.

An additional failure mechanism of the oxide coating is the formation of nodules of precipitates beneath the oxide, which eventually stress and crack the oxide layer. FIGS. 3A through 3D are based on actual photomicrographs taken during the study of the failure modes when aluminum susceptors made from the standard commercial aluminum-magnesium alloy Al 6061 were subjected to many hours of a standard process used to clean the components of a CVD chamber. Specifically, the susceptor under test was maintained at about 425° C. within a vacuum chamber supplied with a mixture of $CF_4$ and $N_2O$. An RF power supply excited the gas mixture to a plasma state, and a negative DC bias voltage was maintained on the susceptor.

The Al 6061 alloy contains about 0.8 wt. % magnesium and other impurities totally about 1.8 to 2.2 wt. %, the principal impurities being, in order of prevalence, silicon, iron, copper, chromium, manganese, and zinc. FIGS. 3A through 3D illustrate the formation of nodules within an aluminum article 300 caused by fluorine (or chlorine) atoms penetrating pinholes in an overlying oxide coating 314 and reacting with impurities in the aluminum to form fluoride or chloride compounds. The growth of a nodule stresses the oxide coating and can lead to a larger crack, thereby admitting more fluorine or chlorine beneath the oxide and permitting the growth of even larger nodules.

Figure 3A:
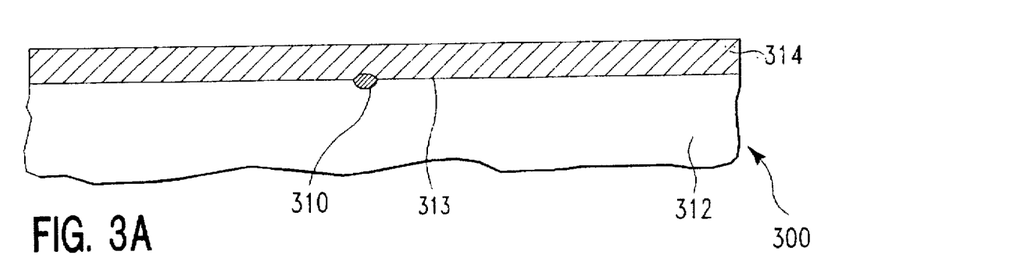
FIGS. 3A–3E illustrate the development of an aluminum fluoride nodule, which leads to the failure of a protective anodized aluminum film over the surface of a standard aluminum material used in the fabrication of semiconductor apparatus.
Figure 3B:
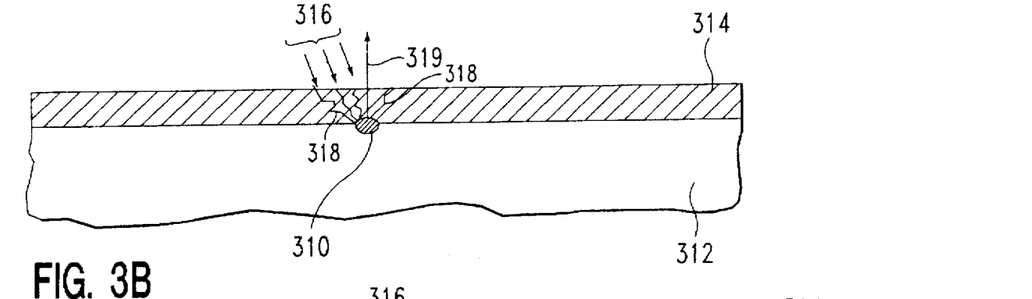
Figures 3C, 3D, 3E:
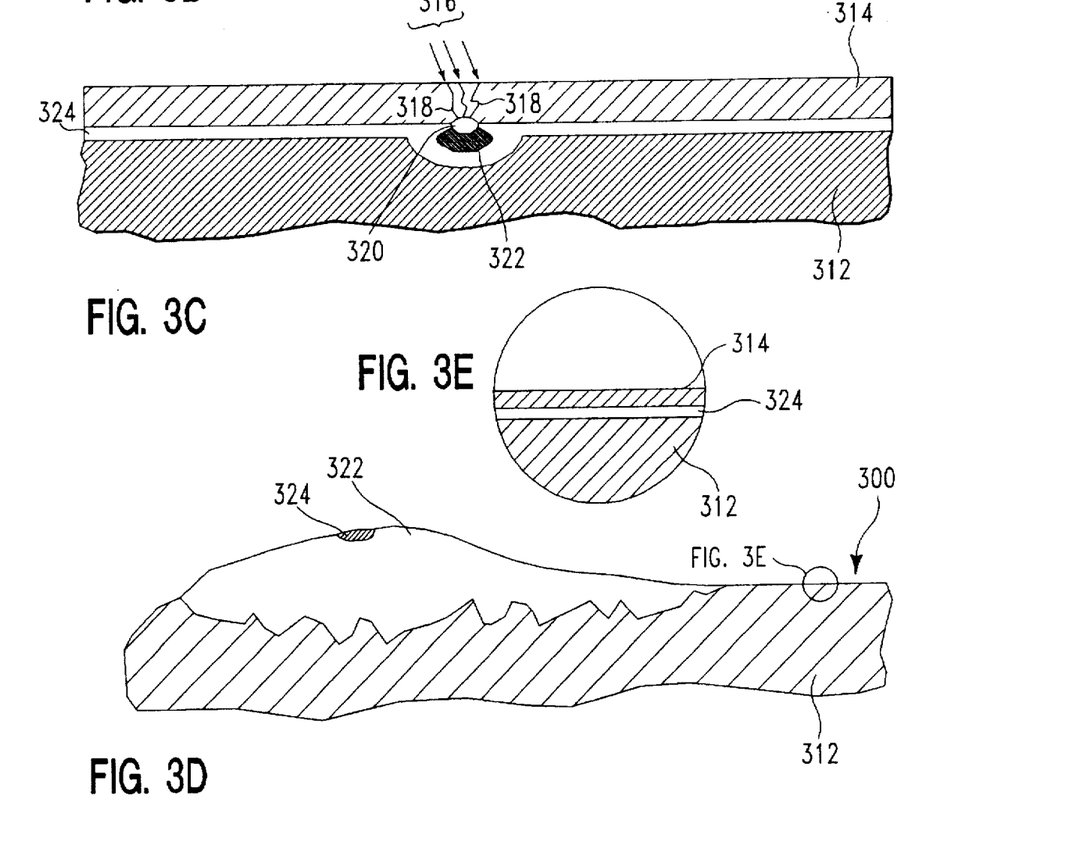

FIG. 3A shows the initiation of a nodule when fluorine (or chlorine) atoms penetrate the barrier layer 313 of the aluminum oxide coating 314, either through a pinhole or by diffusion, and react with a silicon impurity in the aluminum 312 to form a nodule 310 of silicon tetrafluoride (or silicon tetrachloride). As shown in FIG. 3B, the growth of the nodule 310 stresses the oxide layer 314 and can cause cracks 318. Such stresses are aggravated by the high temperatures used for CVD processing, typically 200° to 500° C. The cracks 318 allow the volatile $SiF_4$(or $SiCl_4$) to evaporate as shown by arrow 319, thereby creating an even larger void 320 in the aluminum as shown in FIG. 3C. The cracks also allow more fluorine (or chlorine) to penetrate the aluminum, as shown by arrows 316.

FIG. 3C shows the further development of a nodule 322 by further penetration of fluorine or chlorine 316 through cracks 318 to produce an aluminum fluoride $AlF_3$(or aluminum chloride $AlCl_3$) nodule 322 beneath the anodized layer 314. Eventually the nodule 322 exerts sufficient force on anodized layer 314 to cause a flaking off of anodized layer 314, exposing the nodule 322, as illustrated in FIG. 3D.

The base aluminum 312 used for these tests had a sufficient magnesium content (about 0.8% by weight) for the fluorine penetrating the oxide layer to form a layer of magnesuim fluoride 324 beneath the oxide. However, because of the excessive concentration of other impurities (about 2% by weight) in the aluminum, the damaging nodules 310 and 322 were formed and caused cracks 318 in the oxide before the magnesium flouride layer could build up sufficiently to prevent penetration of fluorine into the base aluminum. We concluded from these tests that preventing corrosion requires low impurity content in the base aluminum as well as the optimum magnesium content which will be explained below.

The presence of iron, copper, chromium, and zinc impurities in the aluminum also causes problems when the impurities diffuse near the surface of the aluminum and react with fluorine or chlorine atoms which penetrate the oxide layer. The resulting metal fluoride or chloride compounds are not as volatile as the $SiF_4$ or $SiCl_4$ compounds described above. However, they create stresses due to their thermal expansion coefficients being much different from that of $MgF_2$ or $MgCl_2$. These stresses can cause cracks in the oxide layer similar to those described above.

Figure 4:
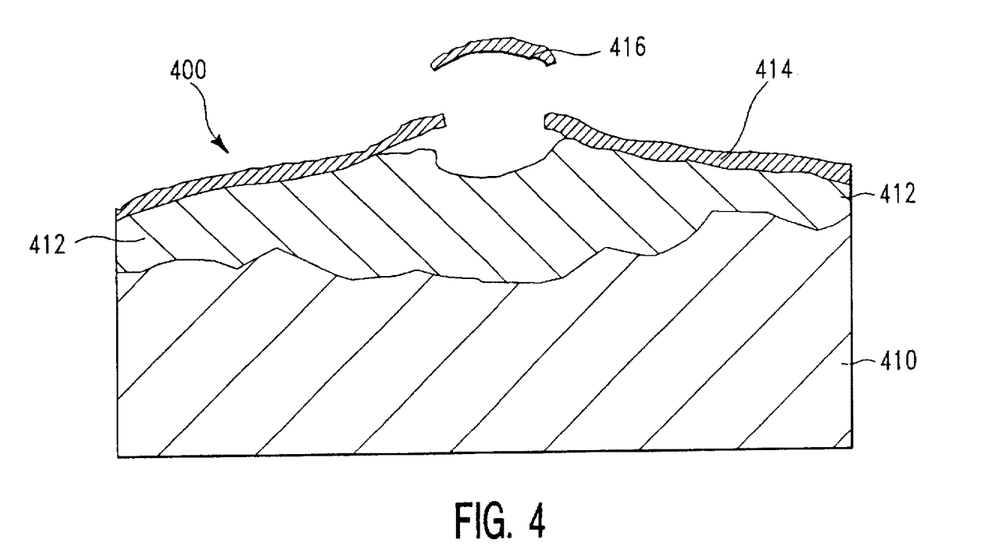
FIG. 4 illustrates the gradual erosion of a surface of an aluminum part due to the formation of aluminum fluoride which is not uniform nor structurally stable, and which flakes off with use of the aluminum part.

FIG. 4 illustrates the failure mechanism we observed when testing the effect of the same $CF_4$ and $N_2O$ plasma cleaning process on a susceptor 400 fabricated from Al 1100, which is an aluminum having a much lower magnesium content (0.023 wt % in our sample) than the Al 6061 just described, and a somewhat higher impurity content of about 3 wt %, the principal impurity being iron at about 0.5 wt %. Al 1100 does not contain enough magnesium to form a protective layer of $MgF_2$(or $MgCl_2$) which could limit the amount of halogen atoms penetrating the oxide layer 414 into the base aluminum 410. Consequently, a thick layer 412 of $AlF_3$ (or $AlCl_3$) builds up over time as fluorine (or chlorine) penetrates pinholes in the oxide layer and reacts with the underlying aluminum 410. Because the distribution of pinholes in the oxide is nonuniform, the thickness of the aluminum halide layer 412 is correspondingly nonuniform. This thickness nonuniformity causes stresses; in fact, at points where the contour of the aluminum halide layer changes rapidly, the stress can change from compressive to tensile. Such stresses can cause portions 416 of the oxide layer 414 to flake off, thereby exposing the underlying aluminum to accelerated corrosion.

Inventive Corrosion-Resistant Material and Method of Fabrication: Overview

According to our invention, an aluminum (or aluminum-magnesium alloy) article is provided with a corrosion-resistant protective layer of a magnesium halide, preferably magnesium fluoride. Our invention also requires the aluminum to have a very low concentration of mobile impurity atoms, either throughout the aluminum article, or at least in a region adjacent the surface of the article.

An aluminum article according to our invention resists corrosion caused by halogen-containing species (such as $Cl_2$, $F_2$, $NF_3$, $CF_4$, $CHF_3$, $C_2F_6$, HF, and $BCl_3$) typically used in etch processes and CVD chamber cleaning processes in semiconductor fabrication equipment. The magnesium halide layer prevents halogen atoms or ions from penetrating through the layer to react with the underlying aluminum to form compounds which, as explained earlier, can cause stresses and cracks in the aluminum article.

Impurity Content of Aluminum

As previously described, the low concentration of mobile impurities other than aluminum and magnesium prevents the formation of nodules and voids within the aluminum which could lead to cracking or flaking of the surface of the article. By mobile impurities, we mean species other than aluminum or magnesium which can diffuse readily in the aluminum matrix. Such mobile impurities include metals, transition metals, semiconductors, and elements which can form semiconductor compounds such as gallium, antimony, tellurium, arsenic, and polonium.

Ideally, the mobile impurity concentration should be low enough that there is a low probability of an impurity diffusing to the surface of the aluminum article. The higher the temperature at which the article will be operated, the higher the mobility of the impurities, and therefore the lower the impurity content must be, because impurities will be likely to diffuse to the surface from a greater depth. The higher the mobility in aluminum of a given impurity species, or the higher its vapor pressure at temperatures used for semiconductor processing, the lower its concentration must be. Of course, species which are considered especially damaging to semiconductor processes—such as sodium, zinc, noble metals, and alkalai earth metals—should be present in especially low concentrations.

For a given impurity concentration, it generally is more detrimental for a single impurity species to constitute the majority of this concentration than for the same concentration to be composed of a number of different impurity species. Impurities of the same species are more likely to aggregate to form a single, large nodule than the same amount of impurities of several different species.

Another factor affecting the permissible impurity concentration is that impurities generally do not have a uniform spatial distribution in aluminum material. Therefore, if the aluminum from which an article is manufactured has a certain overall impurity concentration, there is a statistical risk that the impurities in the article will have a higher than average concentration near the surface, thereby increasing the risk of an impurity migrating to the surface and causing a defect. To reduce this statistical risk, an even lower impurity concentration than otherwise would be necessary may be preferred.

We tested the invention by manufacturing twelve susceptors using Al 6061 having impurities of about 0.6 wt % Si and progressively smaller amounts of iron, copper, and chromium. We found that most susceptors had a short lifetime because the silicon diffused to the surface and caused defects. However, some susceptors, through statistical variation, had a much lower impurity content, and they had an exceptionally long lifetime. Therefore, we estimate that aluminum used to practice our invention should have a concentration of mobile impurities no worse than 0.2% by weight, with 0.1% and 0.05% having progressively lower probabilities of defects caused by impurities. Preferably, no single mobile impurity species should constitute more than half of these respective amounts.

Process for Creating Magnesium Halide Protective Layer

According to our novel process, the magnesium halide protective layer for the aluminum article is created by incorporating a concentration of magnesium within a specified optimum range within the aluminum, and then exposing the article to a halogen-containing species so that the magnesium reacts with the halogen to form the magnesium halide layer. The magnesium can be incorporated in the entire article, or else the magnesium can be incorporated only in the region where the protective layer is to be formed adjacent the surface of the article. The optimum magnesium concentration range will be explained below, after the description of how the magnesium halide layer is created.

The magnesium halide layer initially is created by exposing the article to an environment containing a halogen-containing reactive species, most preferably fluorine, or next preferably chlorine. Fluorine will be referred to in the following description with the understanding that chlorine or another halogen could be substituted for the fluorine.

We preferably use a conventional reaction chamber designed to perform a plasma etch or plasma cleaning process, using an etching or cleaning gas mixture including a fluorine precursor such as $CF_4$, $C_2F_6$, or $NF_3$. Because the rate of formation of the magnesium fluoride layer is limited by the rate of diffusion of magnesium to the surface, and not by the availablility of fluorine, we excite the fluorine-containing plasma with an RF power level about half the level we normally would use for cleaning the same reactor chamber using the same gas mixture.

Preferably, a negative bias voltage is applied to the aluminum so that fluorine ions are accelerated toward, and better penetrate, the surface of the article. As is well known, the negative bias voltage can be applied either by a DC power supply, or by an RF power supply connected to the article through a series-connected capacitor.

The temperature of the article during the formation of the initial magnesium fluoride layer preferably is sufficiently below the vaporization temperature of magnesium to prevent the magnesium which diffuses to the surface of the article from evaporating before it reacts with the fluorine. Evaporation of magnesium is not detrimental to the integrity of the aluminum article (e.g., the susceptor). However, the evaporated magnesium will deposit a black film on surfaces within the vacuum chamber. If a production etch or CVD chamber is used to deposit the initial magnesium fluoride layer, depositing a black film on chamber surfaces may be unacceptable.

More importantly, if any oxygen is present within the chamber, the evaporated magnesium will oxidize and form undesireable particulates. Accordingly, the halogen-containing gas mixture used to create the initial $MgF_2$ layer should contain as little oxygen as possible. Other impurities also should be minimized to prevent the incorporation of other compounds in the magnesium fluoride layer. Preferably, this is facilitated by operating the chamber at a pressure below 1 torr.

As described more fully below, we have found that applying an aluminum oxide layer, or other cohesive protective layer, over the surface of the aluminum article before the magnesium fluoride layer is created greatly inhibits the evaporation of magnesium, thereby allowing the use of a higher temperature while creating the magnesium fluoride layer.

Conversely, reducing the temperature reduces the mobility of the magnesium within the aluminum body of the article, which has two undesireable consequences. Firstly, as the temperature is reduced below the magnesium vaporization point, the mobility of magnesium appears to decline faster than the respective mobilities of less mobile impurities such as iron and silicon. Consequently, keeping the temperature as high as possible appears to preferentially maximize the diffusion of magnesium to the surface so that the fluorine will react with the magnesium rather than the impurities. Secondly, reducing the mobility of the magnesium prolongs the time required to create the initial magnesium fluoride layer. Because the reaction chamber is expensive capital equipment, it is desirable to minimize the time the chamber is dedicated to creating the initial magnesium halide layer rather than processing semiconductor wafers.

Therefore, to avoid defects in the magnesium halide layer caused by the formation of halides of mobile impurities in the aluminum, and to maximize the speed of the protective layer formation process, a regulated heater preferably maintains the article at a temperature just low enough to prevent evaporation of the magnesium. We prefer a temperature range of 150° to 325° C.

Specifically, if the aluminum article is anodized (as described below) before the initial magnesium fluoride layer is created, then we prefer a temperature of 250° to 300° C. during the creation of the initial $MgF_2$ layer. However, if no anodization or other protective coating is applied to the aluminum, then we prefer a temperature of about 175° C. during the formation of the inital $MgF_2$ layer to avoid excessive evaporation of magnesium.

After an initial, continuous layer of magnesium fluoride is formed, this continuous layer will inhibit the evaporation of magnesium, hence the temperature of the article can be raised. We prefer to form about a 25 angstrom layer of $MgF_2$ at the low initial temperature. The rate at which the $MgF_2$ layer forms is a strongly increasing function of the magnesium concentration in the aluminum article and the temperature of the article. In tests performed on an aluminum susceptor having a 2 wt % magnesium content, it took about 70 minutes to form a 25 Å layer of $MgF_2$. The process is very slow because it depends on the diffusion of magnesium from the body of the aluminum article to the surface where the $MgF_2$ layer is formed.

After the initial, continuous $MgF_2$ layer is formed, the aluminum article can be placed into production service in a semiconductor process chamber such as a CVD or etch reaction chamber. The $MgF_2$ layer will inhibit the outgassing of magnesium and impurities at the high temperatures (200° to 500° C.) typical in CVD and etch processes, thereby reducing particulates caused by such outgassing. Furthermore, when exposed to halogen-containing etchants during either etch processes or chamber cleaning processes, the $MgF_2$ layer will prevent the halogens from penetrating into the aluminum body and causing defects.

In particular, when the article is exposed to fluorine-containing etchants, the fluorine will react with any magnesium which migrates from the aluminum body to the boundary of the magnesiums fluoride layer, thereby progressively increasing the thickness of the protective magnesium fluoride layer. After a few hundred hours of exposure to fluorine chamber cleaning cycles, the magnesium fluoride layer will stop growing because the adjacent region in the aluminum will become depleted of free magnesium. For example, with aluminum having a 2 wt % magnesium content, the $MgF_2$ layer stopped growing when the layer was about 2 microns thick, and the underlying region depleted of free magnesium was about 100 to 200 microns thick.

Magnesium Content

As stated earlier, the just-described process for creating a magnesium-halide layer, preferably a $MgF_2$ layer, in a region of the aluminum article adjacent the surface requires a concentration of magnesium within a certain optimum range to be incorporated in the region before the magnesium is reacted with fluorine. The magnesium concentration is based on the following requirements. If the concentration is too low, the magnesium fluoride layer will be discontinuous or of insufficient density to protect the underlying aluminum layer from corrosion (i.e., insufficient to prevent halogen species from penetrating the $MgF_2$ layer to react with the underlying aluminum). The absolute lower limit on the amount of magnesium that must be present in the aluminum article can be calculated from the mass of a $MgF_2$ layer of the desired thickness, for example, one micron. Since $MgF_2$ is about 70% Mg by weight, the aluminum article must contain a total mass of Mg equal to least 70% of the mass of the desired $MgF_2$ layer. This calculation assumes that 100% of the Mg in the aluminum will migrate to the surface and be incorporated in the $MgF_2$ layer, thereby completely depleting the aluminum of free magnesium. Since this assumption is not realistic, a higher Mg content should be used in practice.

Conversely, the maximum desireable magnesium content in the aluminum is determined by the fact that, if the magnesium concentration is too high, magnesium atoms can outgas or evaporate from the surface of the aluminum article, especially at high temperatures and under low pressures typically encountered by aluminum articles (such as susceptors) used in CVD or etch chambers for semiconductor device fabrication.

Additional considerations affect the choice of magnesium content between the extreme limits of a Mg content too low to form a continuous $MgF_2$ layer, and a Mg content too high to avoid contamination of the process chamber due to magnesium outgassing. Between these limits, a higher Mg content will afford the article a desireable "self-healing" property, in that small scratches on the surface of the article will be healed by the formation of a new $MgF_2$ layer at the scratch when the aluminum article is exposed to fluorine during etch or chamber cleaning processes. Conversely, a lower Mg content will reduce the tendency of the article to outgas Mg, thereby reducing or eliminating the thickness of the initial, continiuous $MgF_2$ layer that must be formed before the article can be placed into production service in a CVD or etch process chamber.

We have found that a magnesium concentration of about 0.1% to about 1.5% by weight satisfies these requirements.

Our tests show that, at temperatures above about 150° C. and pressures below about 1 Torr, surface evaporation of magnesium becomes a problem at concentrations of about 1.2% to about 1.5%, depending on the amount of magnesium or magnesium oxide considered tolerable to be released into the semiconductor process chamber. Conversely, we believe concentrations of magnesium below about 0.1% by weight will not produce a $MgF_2$ layer providing adequate corrosion protection. Preferably the magnesium concentration in this surface-adjacent region of the article should be about 0.3% to about 1.2% by weight, and more preferably about 0.3% to 0.8% by weight.

As stated earlier, the required magnesium content can be incorporated in the entire aluminum article, or only in a region of the aluminum article adjacent the surface. The simplest and presently preferred alternative is to fabricate the entire article of an aluminum-magnesium alloy having the required magnesium content. The alloy also must have the low mobile impurity concentration specified above, that is, less than about 0.2% by weight, and preferably much less. Presently, such an alloy must be specially ordered from an aluminum supplier, because standard alloys are unsuitable. For example, Al 1100 is unsuitable because its magnesium content is only 0.025% and its impurity content is excessive. Al 6061 has excessive magnesium content and excessive impurities.

One possible method of incorporating the required magnesium concentration in the aluminum is to fabricate the article by a conventional casting method, and use as the feed stock both high purity magnesium material and high purity aluminum material. Preferably the aluminum material should have no more than 0.05% impurities, and the magnesium should have no more than 0.1% impurities. Such high purity material is readily available commercially. The proportion of magnesium to aluminum should equal the preferred magnesium concentration as discussed above.

A less preferred alternative is to fabricate the article of a high purity aluminum alloy, and then augment the magnesium concentration in a region of the article adjacent the surface. For example, magnesium could be incorporated into an outer layer of the article by a magnesium physical vapor deposition (PVD) process such as sputtering or thermal evaporation, or even by magnesium ion implantation. The mass of magnesium deposited or implanted should be at least 70% of the mass of the desired $MgF_2$ layer, and preferably much greater, for the reasons explained earlier.

Protective Layer Overlying the Magnesium Halide Layer

Figure 5:
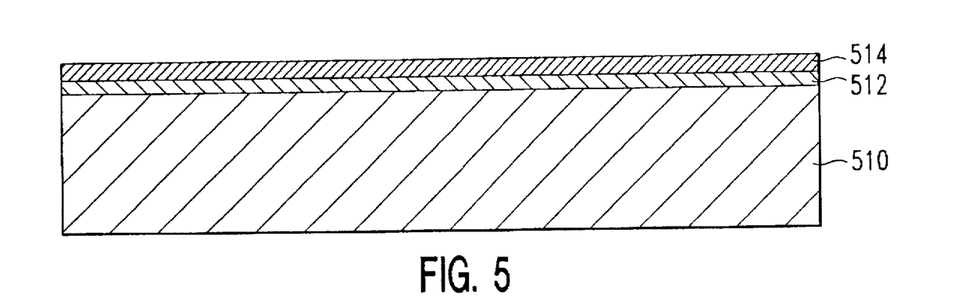
FIG. 5 shows the more preferred structure of the present invention, comprising a top layer of anodized aluminum, an underlaying layer of magnesium halide, and the aluminum-magnesium alloy as a base surface.

As shown in FIG. 5, for maximum protection of the aluminum article 510, it is preferable to combine the magnesium halide protective layer 512 just described with an overlying layer of a cohesive material 514 such as a conventional anodization layer (aluminum oxide $Al_2O_3$). A disadvantage of leaving the magnesium halide layer unprotected is that, in thicknesses above roughly 1000 Å (0.1 micron), the magnesium halide is relatively soft and incohesive, so that magnesium halide particles can readily flake off when subjected to mechanical abrasion or thermal stresses. Providing a layer of a strong, cohesive material over the magnesium halide will protect the magnesium halide from damage, while retaining the benefits of the superior resistance of the magnesium halide to corrosion by halogen-containing environments.

Notwithstanding the softness of the magnesium halide, the structure shown in FIG. 5 has the advantage that small scratches and nicks in the protective layers are self-healing, because the magnesium halide layer will regrow upon exposure to a halogen-containing environment.

Most preferably, the cohesive layer is aluminum oxide ($Al_2O_3$), and next preferably it is aluminum nitride (AlN). An $Al_2O_3$ layer can be formed by a conventional electrolytic anodization process. An AlN layer can be deposited on an aluminum by a conventional reactive aluminum deposition process in which an aluminum film is deposited on the article by sputtering or vapor deposition in the presence of nitrogen gas at high temperature or nitrogen plasma. (Throughout the following description, we use the term "anodize" to include the formation of either an $Al_2O_3$ or an AlN coating on an aluminum article, even though AlN is not within the conventional meaning of the term "anodize".)

A further advantage of anodizing the aluminum article is that $Al_2O_3$ and AlN are impermeable to oxygen. Preventing the penetration of oxygen is advantageous to prevent magnesium which diffuses to the surface of the aluminum from forming magnesium oxide rather than the desired magnesium halide. $Al_2O_3$ and AlN also inhibit the outgassing of magnesium and other impurities into the semiconductor process chamber, which could contaminate the semiconductors being fabricated in the chamber.

It is particularly preferred to form an aluminum oxide or aluminum nitride coating on the aluminum article before the magnesium halide layer is formed (as described above under "Process for Creating Magnesium Halide Protective Layer"). As explained in the preceding paragraphs, aluminum oxide and aluminum nitride are highly impermeable to oxygen, and they inhibit outgassing of magnesium. Accordingly, if an $Al_2O_3$ or AlN coating is applied to the aluminum article before the magnesium halide layer is formed, the aluminum oxide or nitride will prevent magnesium which diffuses to the surface of the article from forming magnesium oxide rather than the desired magnesium halide protective layer. Consequently, the initial, low temperature magnesium halide layer formation step can be performed at a higher temperature to reduce the time required for this initial step. Specifically, our presently preferred temperature for this initial step is 175° C. if the article is not anodized, and 250° to 300° C. if it is anodized.

In fact, the overlying $Al_2O_3$ or AlN may even eliminate the need for this initial low temperature magnesium halide layer formation step, so that the anodized aluminum article can be used in a chamber for processing semiconductors immediately, without diverting the chamber to the non-productive activity of initiating the article at low temperature so as to form the initial magnesium halide layer. As the article is exposed to halogens within the semiconductor process chamber (e.g., during cleaning or etching processes), the halogens will diffuse through the aluminum oxide or nitride layer and react with the magnesium in the aluminum to form a magnesium halide layer immediately below the $Al_2O_3$ or AlN.

On the other hand, there is good reason for initially forming the magnesium fluoride layer at a relatively low temperature before subjecting the aluminum article to the high temperatures needed for processing semiconductor substrates. Magnesium fluoride has a thermal expansion coefficient intermediate those of aluminum and aluminum oxide, so that a magnesium fluoride layer between the aluminum oxide coating and the base aluminum reduces stress gradients due to temperature changes. Therefore, to reduce the risk that the anodize coating will crack due to thermal stresses, it is preferable to form at a low temperature, such as 250° C., about a 25 angstrom thick layer of magnesium fluoride beneath the aluminum oxide before subjecting the aluminum article to semiconductor substrate process temperatures.

Because aluminum oxide and aluminum nitride are permeable to fluorine, it is easy to form a MgF$_2$ layer underneath an Al$_2$O$_3$ or AlN layer. First, the aluminum article is anodized by a conventional anodization process. Then, the anodized article is exposed to a fluorine-containing environment in accordance with the process described earlier under "Process for Creating Magnesium Halide Protective Layer". The fluorine will penetrate the anodize layer and react with the magnesium that diffuses to the surface to form a MgF$_2$ layer directly underneath the anodize coating.

If for some reason it is desired to form the magnesium halide layer before forming the aluminum oxide or nitride coating, this could be accomplished as follows. First, form the magnesium halide layer by exposing the article to a halogen-containing species as described earlier under "Process for Creating Magnesium Halide Protective Layer". Second, using a conventional sputtering or vapor deposition process, deposit either an aluminum film or an aluminum oxide film over the magnesium halide layer. If an aluminum film was deposited, it should be anodized using a conventional anodization process.

We claim:

1. An article of manufacture useful in semiconductor processing having a surface which is resistant to corrosion by halogen-containing species, comprising:
   a) a body composed of aluminum having a magnesium concentration in the range of zero to about 1.5% by weight and having a total concentration of impurities other than magnesium no greater than about 0.2% by weight; and
   b) a layer, comprising a magnesium halide compound, overlying the body and beneath the surface of the article, the layer being sufficiently thick and continuous to inhibit the penetration of halogen atoms from the surface of the article into the body, whereby said body is rendered corrosion-resistant.

2. An article according to claim 1, wherein the magnesium halide layer comprises magnesium fluoride.

3. An article according to claim 1, further comprising a cohesive film overlying said layer, wherein said cohesive film is permeable to fluorine but substantially impermeable to oxygen.

4. An article according to claim 3, wherein the cohesive film comprises aluminum oxide or aluminum nitride.

5. An article of manufacture useful in semiconductor processing having a surface which is resistant to corrosion by halogen-containing species, comprising:
   a) an aluminum body having an exterior region composed of aluminum having a magnesium concentration in the range of about 0.1% to 1.5% by weight and having a total concentration of impurities other than magnesium no greater than about 0.2% by weight; and
   b) a film overlying the exterior region of the body, wherein the film is permeable to fluorine but substantially impermeable to oxygen, whereby, upon exposure of the article to halogen-containing species, a magnesium halide layer forms in the exterior region of the body underneath the film, to protect the body from corrosion by the halogen.

6. An article according to claim 5, wherein the exterior region encompasses the entire surface of the aluminum body.

7. An article according to claim 5, wherein the film comprises aluminum oxide or aluminum nitride.

8. An article according to claim 5, wherein the magnesium halide layer comprises magnesium fluoride.

9. An aluminum-comprising article useful in semiconductor processing having an exterior surface at least a portion of which is resistant to corrosion by halogen-containing species, wherein said corrosion-resistant portion comprises a protective layer of magnesium halide upon or underlying said portion wherein said magnesium halide layer has a thickness of at least about 0.0025 microns, and wherein at least the portion of said aluminum-comprising article immediately adjacent said magnesium halide protective layer has a magnesium content ranging from about zero % to about 1.5% by weight and a total concentration of mobile impurity atoms of 0.2% by weight or less.

10. The aluminum-comprising article of claim 9, wherein said magnesium halide layer ranges in thickness from about 0.0025 microns to less than about 0.02 microns.

11. The aluminum-comprising article of claim 9 wherein said corrosion-resistant portion is the entire exterior surface of said article.

12. The aluminum-comprising article of claim 9, wherein a film comprising of aluminum oxide or aluminum nitride overlies said corrosion-resistant portion of said exterior surface.

13. The aluminum-comprising article of claim 12, wherein said corrosion-resistant portion is the entire exterior surface of said article and wherein said film overlies said entire exterior surface.

14. The aluminum-comprising article of claim 12, wherein the content of magnesium ranges from about 0.3% to about 1.2% by weight.

15. The aluminum-comprising article of claim 14, wherein the content of magnesium ranges from about 0.3% to about 0.8% by weight.

16. The aluminum-comprising article of claim 12, wherein the total content of mobile impurity atoms in said article is less than 0.2% by weight and wherein said mobile impurity atoms consist of silicon, iron, copper, chromium and zinc.

17. The aluminum-comprising article of claim 16, wherein said mobile impurity atoms further include metal atoms other than magnesium; transitional metals; semiconductors; and atoms which form semiconductor compounds.

18. The aluminum-comprising article of claim 17, wherein said layer of magnesium halide is magnesium fluoride.

19. The aluminum-comprising article of claim 16, wherein said layer of magnesium halide is magnesium fluoride.

20. The aluminum-comprising article of claim 16, wherein no single mobile impurity atom content constitutes more than one half of the total mobile impurity atom content.

21. The aluminum-comprising article of claim 12, wherein said layer of magnesium halide is magnesium fluoride.

22. The aluminum-comprising article of claim 9, wherein the content of said magnesium ranges from about 0.3% to about 1.2% by weight.

23. The aluminum-comprising article of claim 22, wherein the content of said magnesium ranges from about 0.3% to about 0.8% by weight.

24. The aluminum-comprising article of claim 9, wherein the total content of mobile impurity atoms in said article is less than 0.2% by weight and wherein said mobile impurity atoms consist of silicon, iron, copper, chromium and zinc.

25. The aluminum-comprising article of claim 24, wherein said mobile impurity atoms further include metal atoms other than magnesium; transitional metals; semiconductors; and atoms which form semiconductor compounds.

26. The aluminum-comprising article of claim 25, wherein said layer of magnesium halide is magnesium fluoride.

27. The aluminum-comprising article of claim 24, wherein no single mobile impurity atom content constitutes more than one half of the total mobile impurity atom content.

28. The aluminum-comprising article of claim 24, wherein said layer of magnesium halide is magnesium fluoride.

29. The aluminum-comprising article of claim 9, wherein said layer of magnesium halide is magnesium fluoride.

* * * * *